(12) United States Patent  (10) Patent No.: US 8,328,020 B2
Flossmann  (45) Date of Patent: Dec. 11, 2012

(54) HOLDING SYSTEM FOR HORIZONTALLY OR VERTICALLY STACKING FRAMED PHOTOVOLTAIC OR SOLAR THERMAL FLAT MODULES

(75) Inventor: Martin Flossmann, Darmstadt (DE)

(73) Assignee: EckPack Service GmbH & Co. KG, Pfungstadt (DE)

( * ) Notice: Subject to any disclaimer, the term of this patent is extended or adjusted under 35 U.S.C. 154(b) by 338 days.

(21) Appl. No.: 12/661,088

(22) Filed: Mar. 10, 2010

(65) Prior Publication Data
US 2011/0220598 A1  Sep. 15, 2011

(51) Int. Cl.
*B65D 81/02* (2006.01)

(52) U.S. Cl. ........................................ 206/586

(58) Field of Classification Search ................ 211/59.4, 211/41.14, 183, 182, 194; 206/320, 454, 206/386, 499; 108/51.11; 136/251, 291
See application file for complete search history.

(56) References Cited

U.S. PATENT DOCUMENTS

| 3,049,260 | A | * | 8/1962 | Stone ............................... 217/53 |
| 4,244,471 | A | * | 1/1981 | Plante ........................... 206/586 |
| 4,287,990 | A | * | 9/1981 | Kurick ........................... 206/448 |
| 4,385,698 | A | * | 5/1983 | Goguen ........................ 206/586 |
| 4,479,318 | A | * | 10/1984 | Russell ............................ 40/788 |
| 4,518,085 | A | * | 5/1985 | Chisholm et al. ............. 206/454 |
| 4,801,018 | A | * | 1/1989 | Wilde ............................ 206/586 |
| 5,014,163 | A | * | 5/1991 | Lin ................................. 361/796 |
| 5,677,830 | A | * | 10/1997 | Nogas et al. ................... 361/790 |
| 5,715,956 | A | * | 2/1998 | Yoshida ......................... 211/182 |
| 5,803,257 | A | * | 9/1998 | Bartholomew ............... 206/454 |
| 6,354,445 | B1 | * | 3/2002 | Pritz .......................... 211/41.18 |
| 6,817,161 | B1 | * | 11/2004 | Wu et al. .......................... 53/449 |
| D598,756 | S | * | 8/2009 | Robichaud et al. ............ D9/456 |
| 7,712,240 | B2 | * | 5/2010 | Gipson ............................ 40/783 |
| 8,109,393 | B2 | * | 2/2012 | Haeberlein ................. 211/41.14 |
| 2006/0005875 | A1 | | 1/2006 | Haberlein |

FOREIGN PATENT DOCUMENTS
EP  1 617 485  1/2006

\* cited by examiner

*Primary Examiner* — Jennifer E. Novosad
(74) *Attorney, Agent, or Firm* — Collard & Roe, P.C.

(57) ABSTRACT

A material-sparing, reusable stack holding system for supporting and transporting framed photovoltaic or solar thermal flat modules.
The system consists of individual molded parts, which form stable and transport-safe pillars or rails, respectively, among one another by means of mechanical cogging and with the frames of the modules by means of a locking connection. To date, only stack holders, in the case of which the solar modules are stacked in horizontal position with the use side facing up ("sunny side"), were known.
The system disclosed here makes it possible to stack the modules in horizontal as well as in vertical position. In the case of horizontal stacking, the use side can be arranged facing up or down.

16 Claims, 12 Drawing Sheets

HOLDING SYSTEM FOR HORIZONTALLY OR VERTICALLY STACKING FRAMED PHOTOVOLTAIC OR SOLAR THERMAL FLAT MODULES

The invention relates to a material-sparing, reusable stack holding system for supporting and transporting framed photovoltaic or solar thermal flat modules.

The system consists of individual molded parts, which form stable and transport-safe pillars or rails, respectively, among one another by means of mechanical cogging and with the frames of the modules by means of a locking connection.

An outstanding feature of the system according to the invention is that it is equally suitable for vertically as well as for horizontally stacking framed photovoltaic or solar thermal flat modules.

BACKGROUND

Global climate change, fossil energy resources that are becoming rarer and increasing energy prices have made the use of regenerative energies become increasingly significant over the past years with reference to energy policies and economy.

Highly efficient industries have been created in the area of the use of solar energy, for example. Today, photovoltaic modules or also solar thermal flat collectors are mostly mass-produced in a predominantly automated manner using robotized automation.

On principle, the same requirements for economization as have been observed for a long time in the automobile industry, e.g., are valid here and today.

This applies to the final step, in which the end products are combined to form storable, loadable and transportable stacks, to the same degree as to all preceding individual steps of the production process.

When in the past the question relating to the methods of module stacking had rather been a problem related to the transport from the manufacturer to the customer, which had to be solved in a packaging technology-related manner, a consequently economized production today demands for the relocation of the stacking process or of the stacking preparation, respectively, from the packaging storage facility into the end production hall.

In the end phase of the solar module production, the modules are adhered to their frame. After a brief, so-called "holding phase", in which a certain contact pressure is applied, the adhesion process includes a so-called "hardening phase", which extends over a longer period of time.

The invention is to make it possible to make the modules capable of still being stacked in this hardening phase, in that they are already at that point equipped with the elements of a stack holding system, which does not only ensure an economical storing of the module stacks in the operation of the manufacturer, but—without extensive additional packaging measures—also ensures a problem-free loading onto the transport means and a secure transport to the customer.

On principle, two forms of stacking are possible and common for the storage and the transport of photovoltaic modules or solar thermal flat collectors: the stacking in horizontal and in vertical position.

In the case of the horizontal stacking, the use side of the modules can either be arranged facing up ("sunny side up") or down ("sunny side down").

In the case of the vertical stacking, the modules, which are generally formed so as to be elongate-rectangular, can either be positioned with the longer side in vertical direction (upright) or with the shorter side in vertical direction.

Which form of stacking is to be preferred in the individual case can depend on different factors, such as, e.g., the size, weight and format of the modules, the measurements of the pallets to be used, the characteristic of the floor conveying and storage technology in the operation of the manufacturer or also on the best possible loading height use of the transport vehicles.

It was an essential goal of the invention to create a uniform, material-sparing holding system, which can be reused for the highest possible number of storage and transport cycles, and which can be used in equal measure for the horizontal as well as for the vertical stacking forms.

Furthermore, the following requirements had to be fulfilled:

The individual elements of the reusable holding system should be designed as being molded parts, which are as small, handy and light as possible, so as not to complicate their return shipment from the customer to the manufacturer.

The molded parts should be capable of being stressed to a high degree, because the total stress of the modules stacked on top of one another must be accommodated by the holding system and transferred onto the pallet at least in the case of the horizontal stacking.

Chronologically, the individual molded parts of the holding system should not be attached to the frames of the individual modules by means of lateral attachment not only in the course of the actual stacking process, but prior to the actual stacking. A locking device is to ensure that the attached molded parts do not detach from the frame, but remain connected thereto even when the module is lifted, when the module is tilted from the horizontal into the vertical position or when the module is turned over by 180°.

These requirements led to the concept of a holding system for horizontal or vertical stacking of photovoltaic or solar thermal flat modules, which is comprised of individual molded parts, which are made of plastic and which are produced by means of an injection molding process and which can be connected among one another by means of mechanical cogging and which can be connected to form stabile vertical pillars or horizontal rails by means of locking to the module frame.

STATE OF THE ART

In many places, solar modules are still wrapped individually with common disposable packaging made of cardboard for the transport to the customer. Oftentimes, they are additionally equipped with correspondingly formed disposable elements made of cardboard, particle board or hard foam for protecting the corners and edges. The individually packaged modules are bundled by means of tightening straps to form stacks and are braced to the support pallet. The recipient unpacks the modules. The accumulating bulky packaging trash must be professionally disposed of.

Compared thereto, EP 1617485 (A1) discloses a modern and reusable modular stacking system for securely storing horizontally stacked photovoltaic modules during transport, wherein the system is exclusively formed from individual vertically arranged, load-transferring pillars, which in each case consist of molded part elements, which form the respective pillar while being arranged on top of one another and being stacked in one another, wherein each of these molded part elements, on the side which is oriented towards the photovoltaic module that is to be supported, is equipped with a load-accommodating support profile as bearing device for the photovoltaic module on the upper side or lower side, respectively, with one or a plurality of journals or a spring and, on the lower side or upper side, respectively, with one or a plurality of open cavities for the accurately fitting accommodation of the journal/journals or with a groove for accommodating the spring. With reference to its goal and its construction features, this system is only suitable for a stacking of photovoltaic modules in horizontal position. The system can only be applied in the course of the actual stacking process, because it requires the individual framed photovoltaic module to be placed from the top or hooked into the support profiles of the molded part elements, respectively, which are accurately positioned so as to be ready for stacking. A lateral attaching of the individual molded parts onto the individual framed module prior to the actual stacking process, that is, still in the end phase of the module production (hardening phase of the frame adhesive) is not possible according to the construction. Due to the fact that there is no locking to the module frame, the system-forming molded part elements would detach or fall off the module frame, respectively, when the module is lifted, tilted or turned over. EP 1617485 (A1) thus also does not fulfill the requirements for vertically stacking framed solar modules.

THE SYSTEM ACCORDING TO THE INVENTION

It became known that a highly material-sparing holding system, which can be reused for many use cycles, can be created for framed photovoltaic or solar thermal solar modules, which are to be stacked horizontally as well as vertically, when said holding system consists of uniformly formed molded parts, which can be connected among one another by means of mechanical cogging and which can be connected to form stabile vertical pillars or horizontal rails by means of locking to the module frame and which encompass the following main features, which are relevant to the invention:

- The molded parts (viewed in "upright position") have a profile-stabilized vertical wall, which is embodied as a profile, which is closed on one or on both sides, or which is open, preferably in a meander-like manner.
- The vertical wall is equipped with one or a plurality of resilient finger(s) at least on one of their two horizontal closures, in each case comprising a locking device for engaging with the profile of the module frame.
- On one of its two horizontal closures, the vertical wall is furthermore equipped with a row of teeth or with a row of tooth-engagement openings for the mechanical cogging with the adjacent molded part.
- On the other of its two horizontal closures, the vertical wall is equipped with a bearing surface for accommodating the front side of the module frame as well as with a row of tooth engagement openings or a row of teeth for mechanically cogging with the adjacent molded part as well as optionally also with one or a plurality of resilient finger(s) in each case comprising a locking device for engaging with the profile of the module frame.

The following facultative or secondary features furthermore characterize the embodiment of the holding system according to the invention:

Configuration Of The Constructive Components

In the event that provision is made for horizontally stacking the solar modules with the use side facing up ("sunny side up"), the obligatory resilient finger or fingers comprising the locking device as well as the row of tooth engagement openings is/are arranged on the lower horizontal closure of each molded part, while the bearing surface for the accommodation of the front side of the module frame ("sunny side")—optionally equipped with additional locking finger(s)—as well as the row of teeth for mechanically cogging with the adjacent molded part are arranged on the upper horizontal closure of each molded part.

In the event that provision is made for horizontally stacking the solar modules with the use side facing down ("sunny side down"), the bearing surface for the accommodation of the front side of the module frame—optionally equipped with additional closing fingers(s)—as well as the row of tooth engagement openings are arranged on the lower horizontal closure of each molded part, while the obligatory resilient finger or fingers comprising the locking device as well as the row of teeth for mechanically cogging with the adjacent molded part are arranged on the upper horizontal closure of each molded part.

In the event that provision is made for vertically stacking the solar modules, the same molded parts can be used, which are designed for the horizontal "sunny side up" stacking or for the "sunny side down" stacking.

Design Of The Molded Parts

The molded parts of the holding system according to the invention can be embodied as right-angled corner pieces. In this case, after being laterally attached, the molded parts comprise the corners of the module frame. At the horizontal closures, which are provided for this purpose, they encompass one diagonally oriented finger or two resilient fingers, which are arranged so as to be right-angled, e.g., comprising a locking pin, which in each case engage directly with the corner or with the corner area, respectively, of the module frame.

In the embodiment comprising only one finger, the locking pin located at the finger end is embodied on its surface, which is oriented towards the module frame, so as to be right-angled, as it directly engages with the inner corner of the frame profile.

In the embodiment comprising two resilient fingers, the locking pins located at the ends thereof engage with the straight-lined inner edges of the frame profile in the vicinity of the corner and are thus beveled in a straight-lined vertical manner. To ensure an unopposed sliding of each pin across the rear surface of the module frame in response to simultaneously building up flexural stresses of the finger up to the engagement—and rebounding of the finger into the original, tension-free position, the locking pins are designed in a beveled manner so as to taper towards the "finger tip" in the area of their sliding contact surface.

The molded parts of the holding system according to the invention can also be embodied as elongate parts. In this case, the molded parts engage with the sides of the module frames for the purpose of locking at the desired location. Preferably, they are equipped with two resilient fingers on the horizontal closure, which is provided for this purpose. The fingers encompass in each case a straight-lined beveled locking pin, which is beveled towards the tip.

The question whether the corner version or the elongate side version or, if applicable, also a combination of both is to be used, is not solely a material-economical question. It also depends on the format and on the weight of the photovoltaic or solar thermal modules, which are to be held. Attempts with solar modules in commercial standard dimensions have shown that highly transport-stable stacks comprising up to 30 modules can be produced in the case of vertical stacking and comprising up to 50 modules in the case of horizontal stacking after attaching square holding molded parts to the corners of each module frame. In the case of highly elongate special modules, the additional application of two elongate system molded parts to the long sides of each module frame can be advisable so as to prevent an undesired bending of the modules in response to horizontal stacking.

The question whether molded parts, in the case of which the locking finger or the locking fingers is/are applied only on a horizontal plane, are to be used or such, which encompass locking fingers on both horizontal planes, substantially depends on the design of the respective module frame profile. In virtually all cases, it is sufficient for securely holding the molded parts on the module frames to equip the molded part with one or two locking fingers on only one horizontal plane. The use of this embodiment is preferred.

Design Of The Vertical Wall

As a further feature of the holding system according to the invention, the profiled vertical wall of the individual molded parts is embodied as a profile, which is closed on one or on both sides, or as "open" profile. Due to the marginal need for material, the open profile form is to be preferred hereby. To sufficiently secure the holding system against the impact of dynamic shearing forces, in particular in the case of road transport, the profile of the vertical wall is advantageously embodied in a meander-like manner, wherein the meander can be embodied as a curve-shaped profile, thus e.g. with round or oval meanders or as a profile with an angled run, for example with a square, rectangular, trapezoidal or parallelogram-like run. All such profile forms have the characteristic that they form vertical shafts, which lend themselves for the mechanical cogging with the adjacent molded part. To increase the torsional stiffness of the profiled vertical wall, said wall can be additionally stabilized by means of one or a plurality of horizontal bars, for example a horizontal bar arranged at half height of the molded part.

Horizontal Closure Comprising A Row Of Teeth

The profiled vertical wall of each molded part is closed on one of its two horizontal planes by means of a bar or a plate, respectively, which completely covers the openings of the profile. A row of teeth, which serve the engagement with the profile engagement openings of the respective adjacent molded part, is arranged on this closing plate. Position and design of the teeth are thereby matched to the form of the vertical wall in such a manner that the teeth either follow the form of the vertical shafts (e.g. roundish, oval, rectangular, trapezoidal or parallelogram-shaped) or that the teeth are designed as three- or multi-leaf or star-shaped studs, respectively, which engage with the tooth engagement openings of the adjacent molded part in an accurate fit. To ensure that the teeth slide easily into the tooth engagement openings, the end area of the teeth is beveled so as to taper on all sides.

Horizontal Closure Comprising Tooth Engagement Openings

On the other horizontal plane of the profiled vertical wall, each molded part is only partly covered and leaves blank a corresponding number of openings, which are provided for the engaging of the teeth of the adjacent molded part. Position and design of the tooth engagement openings are thereby matched to the form of the vertical wall in such a manner that the teeth accurately follow the form of the vertical shafts located therebelow (e.g. roundish, oval, rectangular, trapezoidal or parallelogram-shaped).

Adaptation Ribs In The Tooth Engagement Area

For a secure and accurate "free of play" fit of the teeth in the tooth engagement area, it is advantageous when the horizontal outer dimension of each tooth having the same form is slightly smaller than the horizontal inner dimension of the vertical shaft of the adjacent molded part, which is to be assigned. This difference is compensated for in that the tooth engagement area of each vertical shaft, which is provided for the cogging, is provided with two or a plurality of horizontal ribs, which ensure an accurate free of play fit of the teeth.

Recesses For Applying Tightening Straps

The rows of teeth—and accordingly also the tooth engagement openings on the other horizontal plane of the molded parts—are interrupted by means of recesses ("tooth gaps"), which provide for the application of tightening straps for securing the transport of the module stack after the stacking process has taken place. In the case of angled holding molded parts for attaching onto the corners of the modules, this recess is located directly in the corner area, so that the module stack can be tightened crosswise diagonally or parallel to the sides of the module stack. In the case of elongate molded parts for attaching onto the sides of the modules, the recess is in each case located in the center of the molded part.

Bearing Surfaces For The Front Side Of The Module Frame

Provision is made on one of the two horizontal planes of the molded parts for horizontal bars or plates closing the corner areas or for so-called "bearing shoes", respectively, which serve to accommodate the front side ("sunny side") of the module frame. On the side facing the module, they form an extension of the horizontal profile closure, which is equipped with teeth or with tooth engagement openings.

To increase the static and dynamic load capacity of the horizontal closures of the molded parts, in particular in the contact areas comprising the module frame, these bearing surfaces are preferably reinforced by means of flat ribs.

As described above, the horizontal bars or plates, respectively, which serve to accommodate the "sunny side" of the module frame can optionally be equipped with one or a plurality of locking fingers.

Bearing Surface Comprising Resilient Finger And Locking Pin

On the other horizontal plane of the molded part, the horizontal closure on the side facing the module also forms a horizontal bearing surface, which is bar-shaped and/or which closes the corner area, to which the obligatory resilient finger or fingers comprising the locking pin is/are connected in each case. They serve to accommodate and lock the molded part on the module frame on the rear side thereof. These bearing surfaces and resilient fingers are preferably also reinforced by means of flat ribs.

Embodiment Of The Molded Parts/Life Cycle/Recycling

The molded parts forming the holding system according to the invention are embodied as plastic injection molding parts, preferably made of polypropylene. The molded parts are designed as reusable parts with approx. 20 cycles. After that, they are delivered to be recycled.

DRAWINGS

The drawings are to illustrate the holding system according to the invention by means of different exemplary embodiments and detail illustrations.

Figure 1:
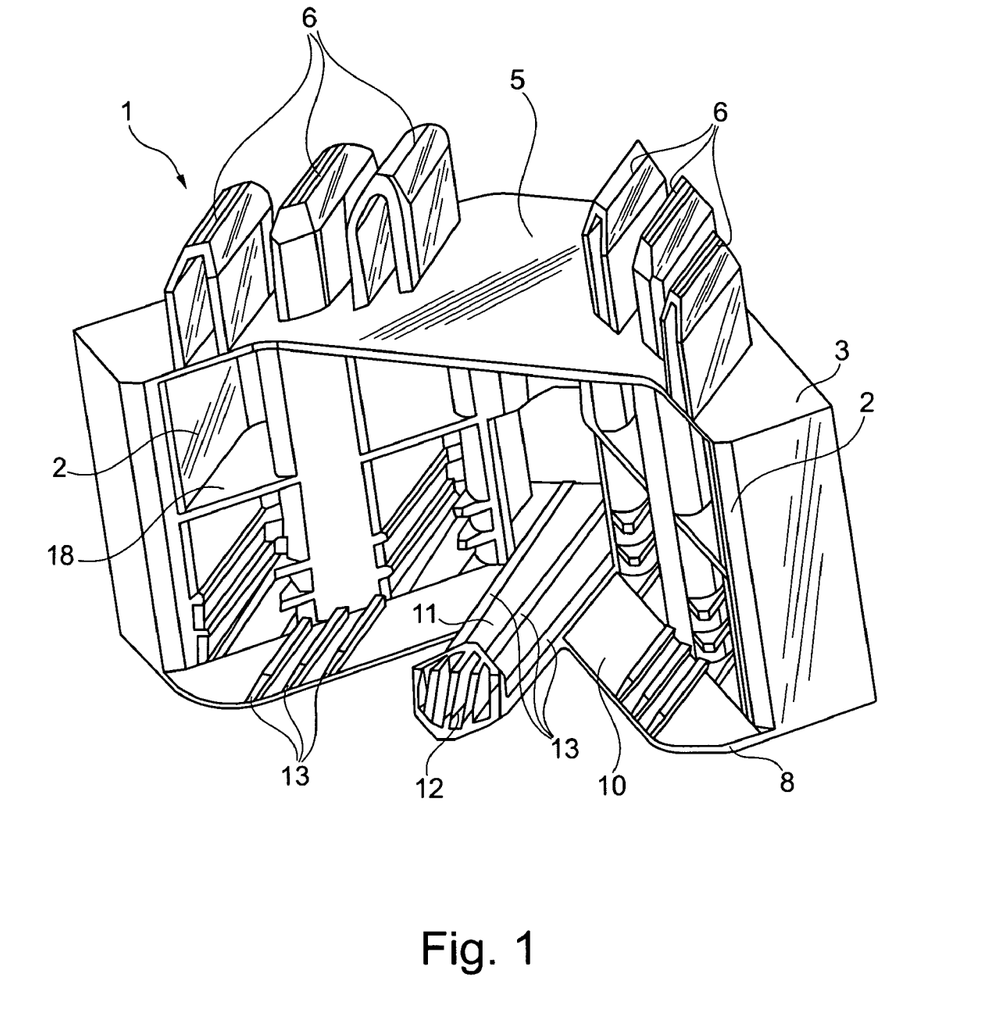
FIG. 1: shows a molded part of the holding system in a perspective view, viewed at an incline from the top.
Figure 2:
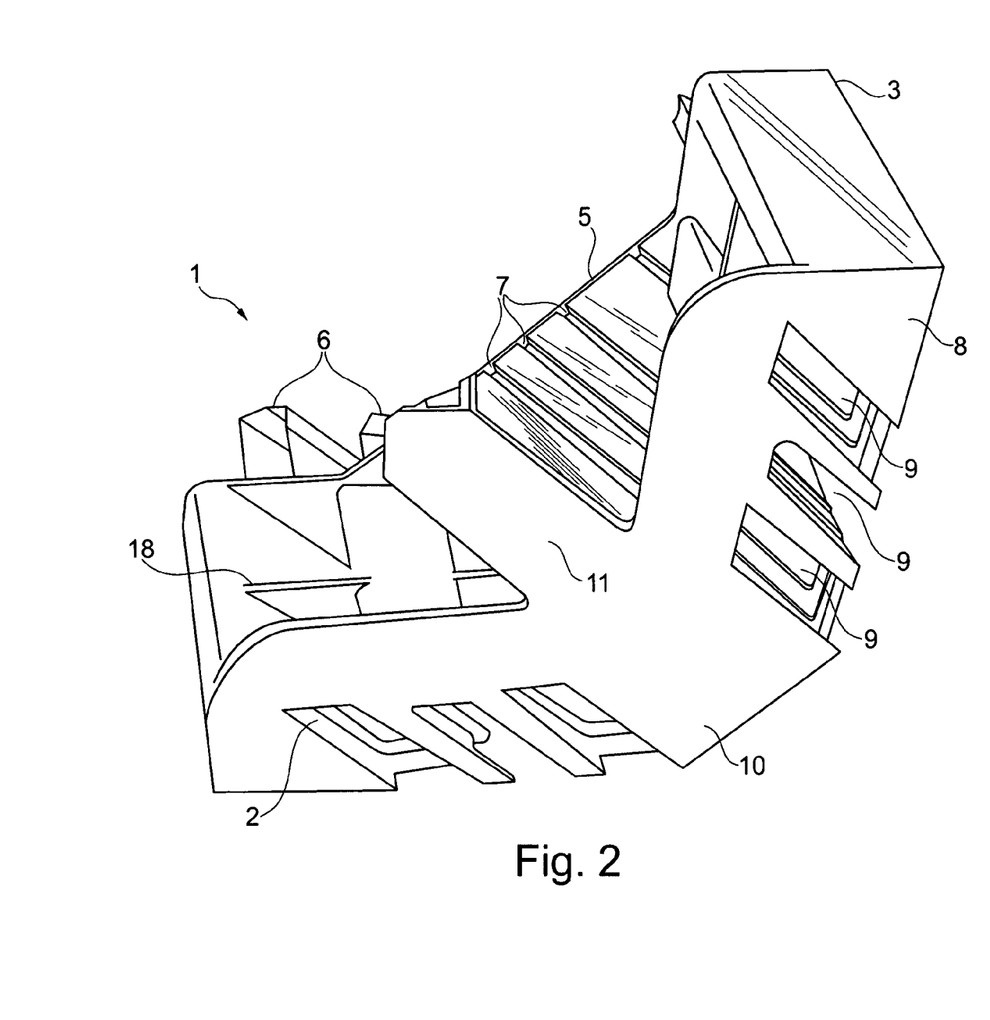
FIG. 2: shows a molded part of the holding system in a perspective view, viewed at an incline from the bottom.

The molded part (1) illustrated in FIG. 1 and in FIG. 2 is embodied as a so-called "corner piece", which is to engage with the corner of a module frame. The molded part has a profiled vertical wall (2), which is designed as being open and comprising angled (in the case shown herein being parallelogram-shaped) meandering run. At half height, the vertical wall (2) is reinforced by means of a horizontal bar (18). On one of the two horizontal closures (3), the vertical wall (2) is closed completely and is equipped with a bearing plate (5) for accommodating the front side of the module frame as well as a row of teeth (6), which is provided for the cogging with the adjacent molded part. On its contact surface towards the module frame, the bearing plate (5) is reinforced by means of flat ribs (7). The other horizontal closure (8) is not closed completely but encompasses tooth engagement openings (9), which are provided for the cogging with the adjacent molded part. The horizontal closure (8), which is interrupted by means of these tooth engagement openings (9), continues with a bearing bar (10) for accommodating the corner of the module frame on the rear side thereof as well as with a diagonally arranged resilient finger (11) comprising a locking pin (12) for engaging with the rear side of the module frame. The bearing bar (10) as well as the resilient finger (11) is reinforced by means of flat ribs (13) on the side facing the module frame.

Figure 3A:
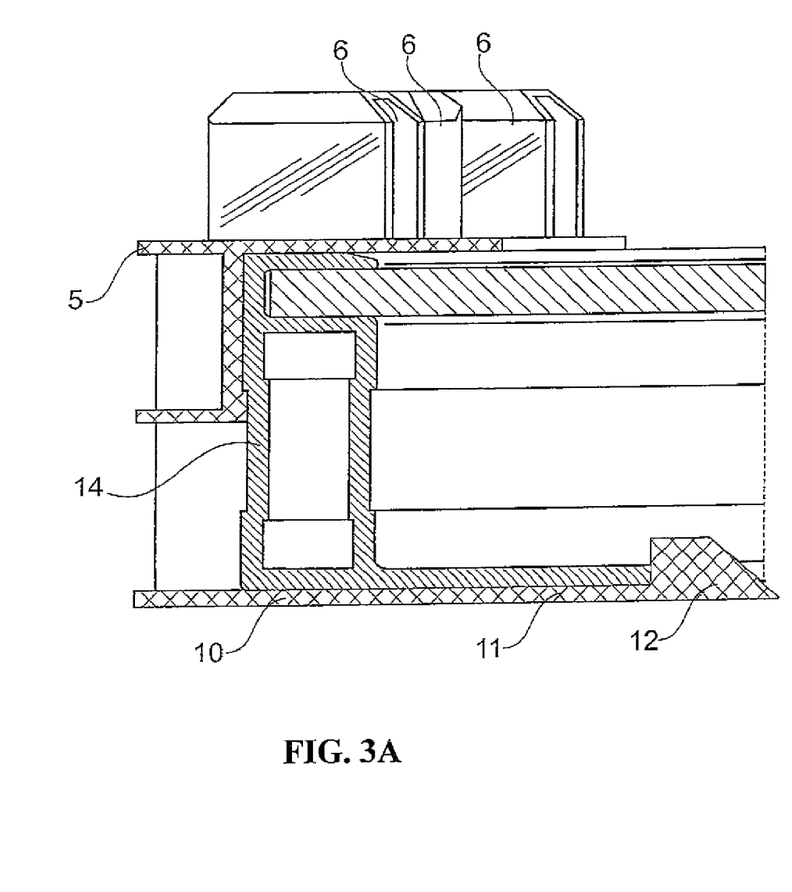
FIGS. 3A and 3B: show a section through a molded part, attached onto a module frame in position "sunny side up"
Figure 3B:
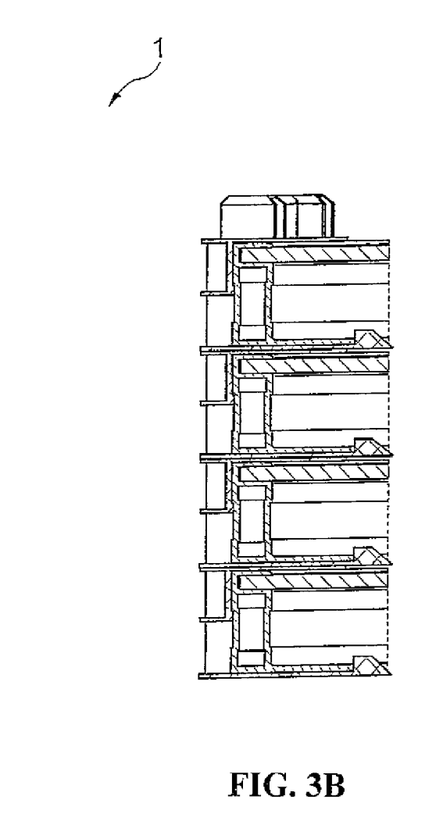

FIGS. 3A and 3B show a section through a molded part (1) according to the invention, which is attached onto the corner of a module frame (14) in the position "sunny side up", that is, with the solar use side facing up. In this case, as is also illustrated in FIG. 1 and in FIG. 2, the bearing bar (10) for accommodating the module frame corner is arranged on the rear side thereof as well and the resilient finger(s) (11) comprising the locking pin (12) is arranged on the lower horizontal plane of the molded part (1). Contrary thereto, the bearing plate (5) for accommodating the module frame corner on the solar use side ("sunny side") of the module as well as the teeth (6) for cogging with the adjacent molded part, are arranged on the upper horizontal closure (5) of the molded part (1). The molded part (1), which is provided with this configuration, is suitable for horizontally stacking solar modules in the position "sunny side up" as well as for vertically stacking solar modules.

Figure 4A:
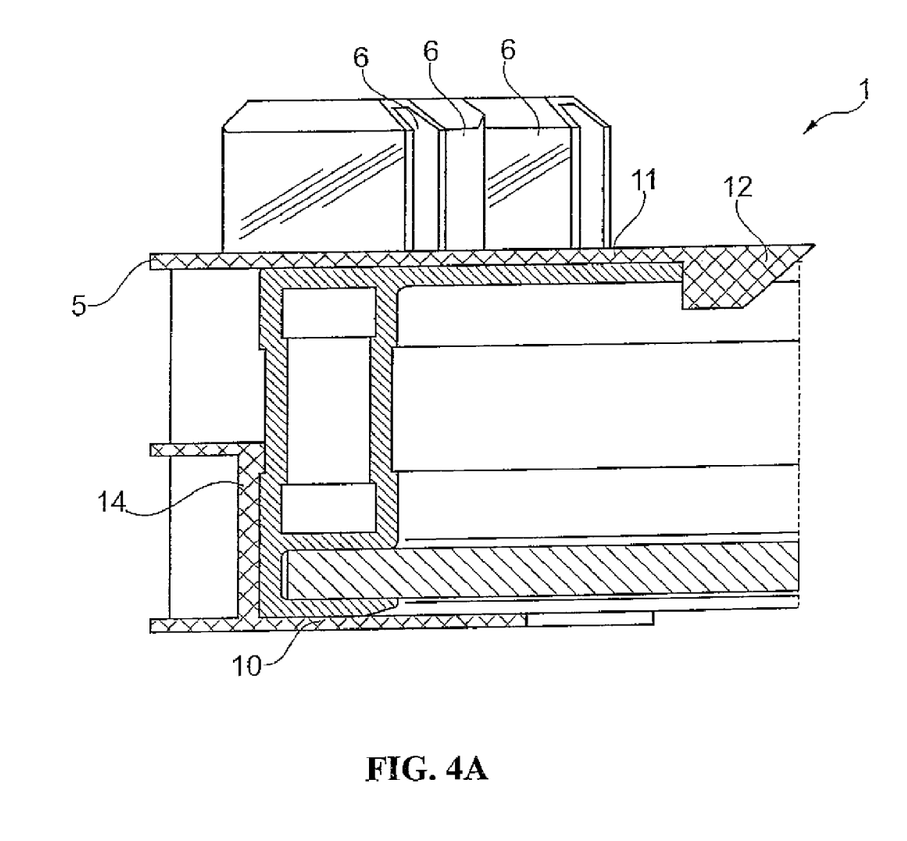
FIGS. 4A and 4B: show a section through a molded part attached in the position "sunny side down"
Figure 4B:
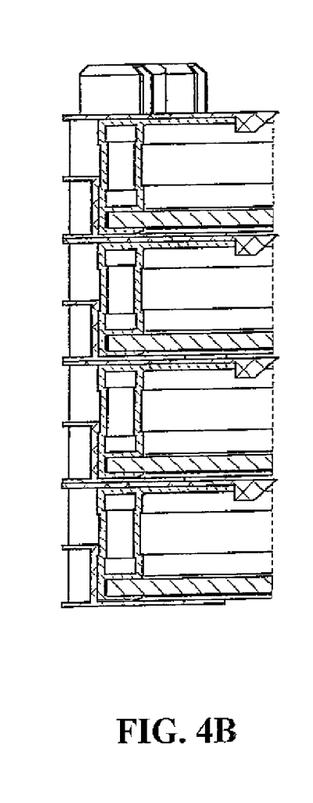

FIGS. 4A and 4B show a section through a molded part (1) according to the invention, which is attached onto the corner of a module frame (14) in the position "sunny side down", that is, with the solar use side facing down. In this case, the bearing bar (10) for accommodating the module frame corner is arranged on the solar use side ("sunny side") of the module on the lower horizontal plane of the module. The bearing plate (5) for accommodating the module frame corner on the rear side thereof as well as the resilient finger(s) (11) comprising the locking pin (12) as well as the teeth (6) for cogging with the adjacent molded part are arranged on the upper horizontal closure (5) of the molded part (1). The molded part (1), which is provided with this configuration, is suitable for horizontally stacking solar modules in the position "sunny side down" as well as for vertically stacking solar modules.

Figure 5:
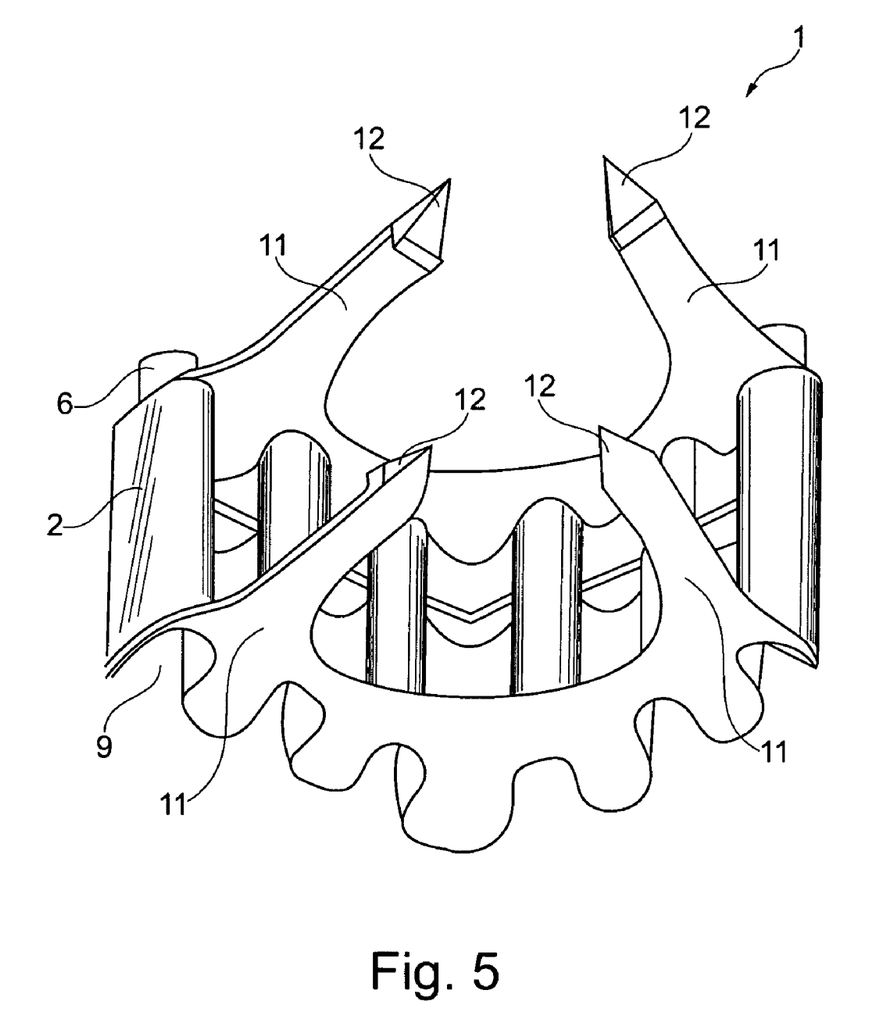
FIG. 5: shows a perspective view of a molded part, which is embodied as a corner piece.

FIG. 5 shows, in a perspective view, a molded part (1) according to the invention, which is embodied as a corner piece and which is to be attached onto a frame corner of the solar module. In this case, the vertical wall (2) is embodied as a curve-shaped meandering meander profile. Accordingly, the tooth engagement openings (9) and the teeth (6) for cogging with the adjacent molded part are embodied in a round manner. In the illustrated example, the molded part (1) on both horizontal closures is in each case equipped with two resilient fingers (11) comprising a locking pin (12), which fingers engage with the frame in each case in the direct vicinity of the corner of the module frame.

Figure 6:
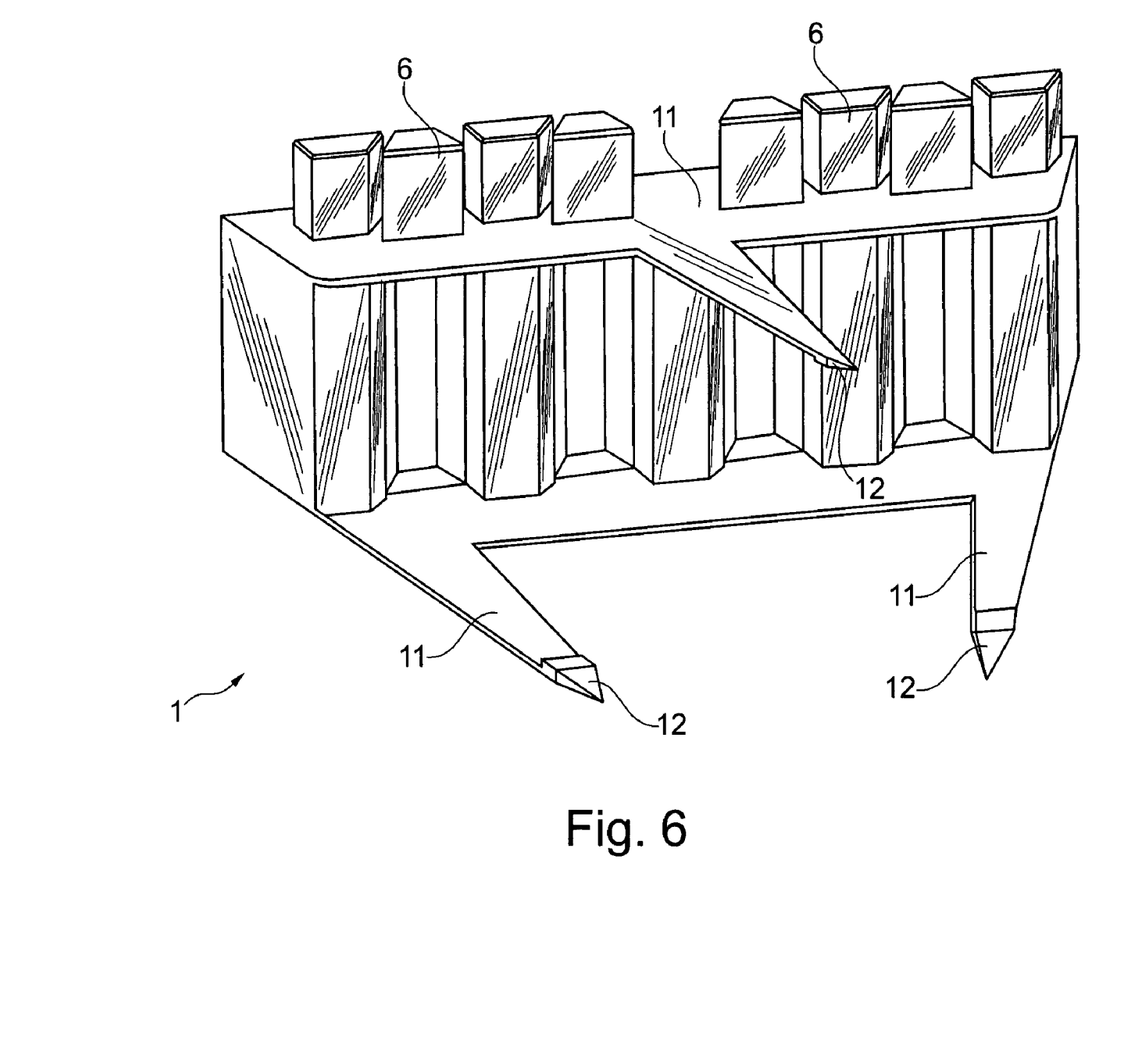
FIG. 6: shows a perspective view of a molded part, which is embodied as an elongate side part.
Figure 7A:
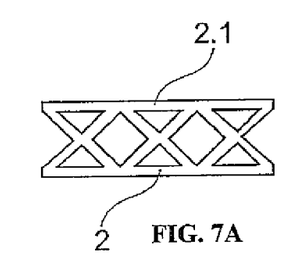
FIGS. 7A-7I: show different embodiments for the design of the profiled vertical wall of a molded part.
Figure 7B:
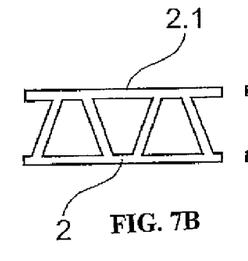
Figure 7C:
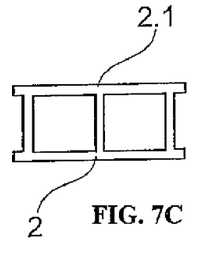
Figure 7D:
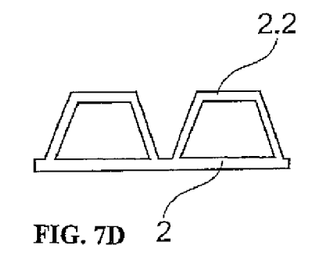
Figure 7E:
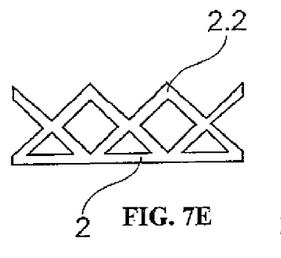
Figure 7F:
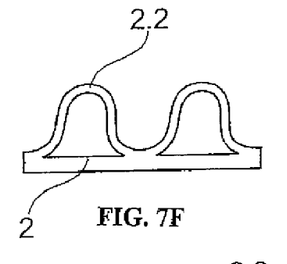
Figure 7G:
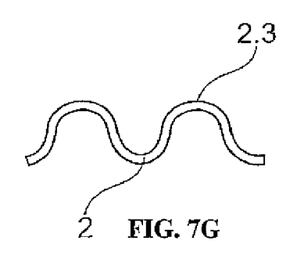
Figure 7H:
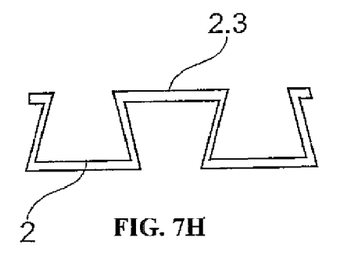
Figure 7I:
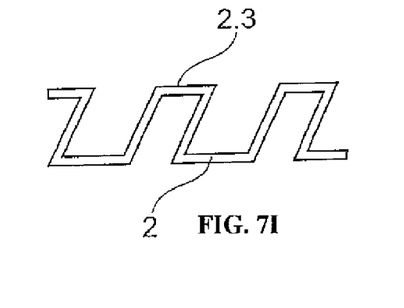
Figure 8A:
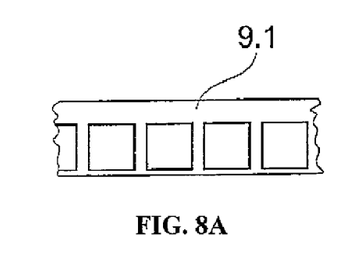
FIGS. 8A-8I: show different embodiments of the tooth engagement openings on the horizontal closure of a molded part, analogous to FIG. 7, FIGS. 9A-9I: show different embodiments of the tooth rows on the other horizontal closure of a molded part analogous to FIG. 7 and to FIG. 8, FIG. 10: shows a detailed section through the tooth engagement area of a vertical shaft with an inserted tooth.
Figure 8B:
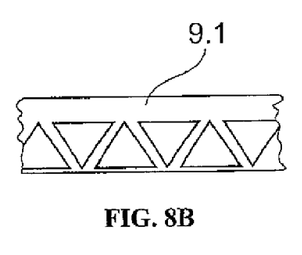
Figure 8C:
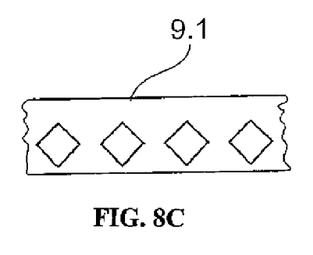
Figure 8D:
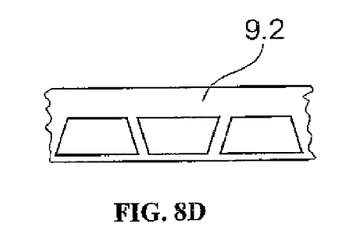
Figure 8E:
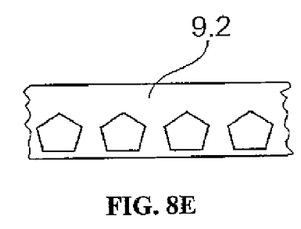
Figure 8F:
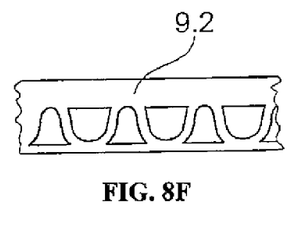
Figure 8G:
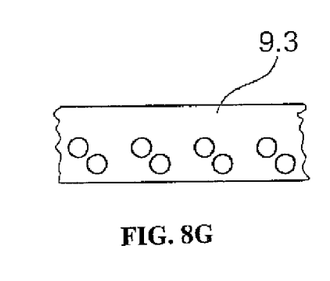
Figure 8H:
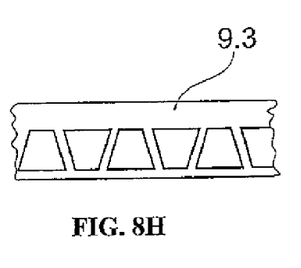
Figure 8I:
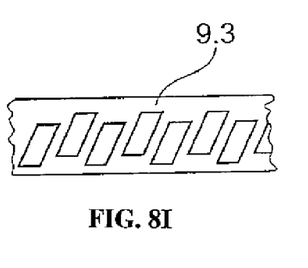
Figures 9A, 9B, 9C, 9D, 9E, 9F:
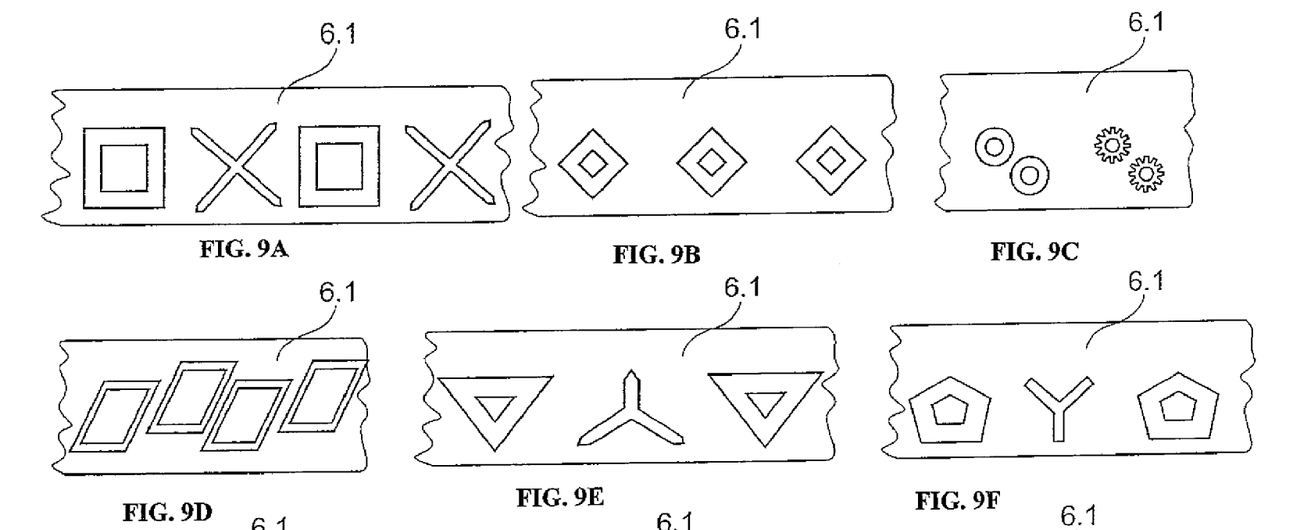
Figure 9G:
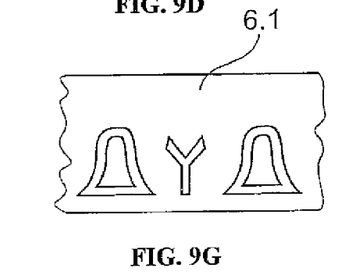
Figure 9H:
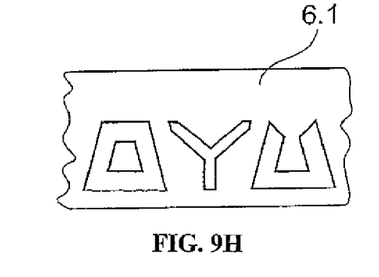
Figure 9I:
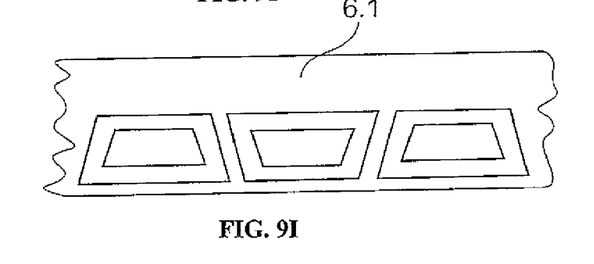

FIG. 6 shows a molded part (1), which is embodied as an elongate side part and which is to be attached onto a frame side of the solar module. In the exemplary embodiment shown herein, the molded part is equipped with two resilient fingers (11) comprising a locking pin (12) on one of the horizontal closures and only comprising one locking pin (11), (12) on the other horizontal closure. The row of teeth (6) is interrupted in the center, so as to provide for the application of a tightening strap for bracing the module stack to the pallet.

FIGS. 7A-7I show different exemplary embodiments for the design of the profiled vertical wall (2) in a sectional illustration. Profile embodiments as vertical wall being closed on both sides and comprising inner bars (2.1), as vertical wall (2.2) being open on one side or as a meander-like profiled vertical wall being open on both sides comprising a curve-shaped or angled meandering run (2.3) are possible on principle. In terms of a material and weight minimization of the molded parts according to the invention, an open profile design (2.3) comprising a curve-shaped or angled meandering run is to be preferred.

FIGS. 8A-8I show—in the style of the alternatives shown in FIGS. 7A-7I—corresponding exemplary embodiments for the design of the tooth engagement openings on one of the two horizontal closures of the molded part according to the invention. The embodiment alternatives 9.1, 9.2 and 9.3 are in each case matched to the alternatives of the vertical profile design shown in FIGS. 7A-7I.

FIGS. 9A-9I show—in the style of the alternatives shown in FIGS. 7A-7I and in FIGS. 8A-8I—corresponding exemplary embodiments for the design of the teeth (6.1), (6.2), (6.3), which are arranged on the other one of the two horizontal closures. The form of the teeth can hereby either be designed in such a manner that it exactly follows the respective form of the tooth engagement openings (9.1), (9.2), (9.3) shown in FIGS. 8A-8I. However, the teeth can also be designed as three- or multi-leaf or star-shaped studs (14). To ensure that the teeth slide easily into the tooth engagement openings, the end area of the teeth is beveled so as to taper on all sides (15).

Figure 10:
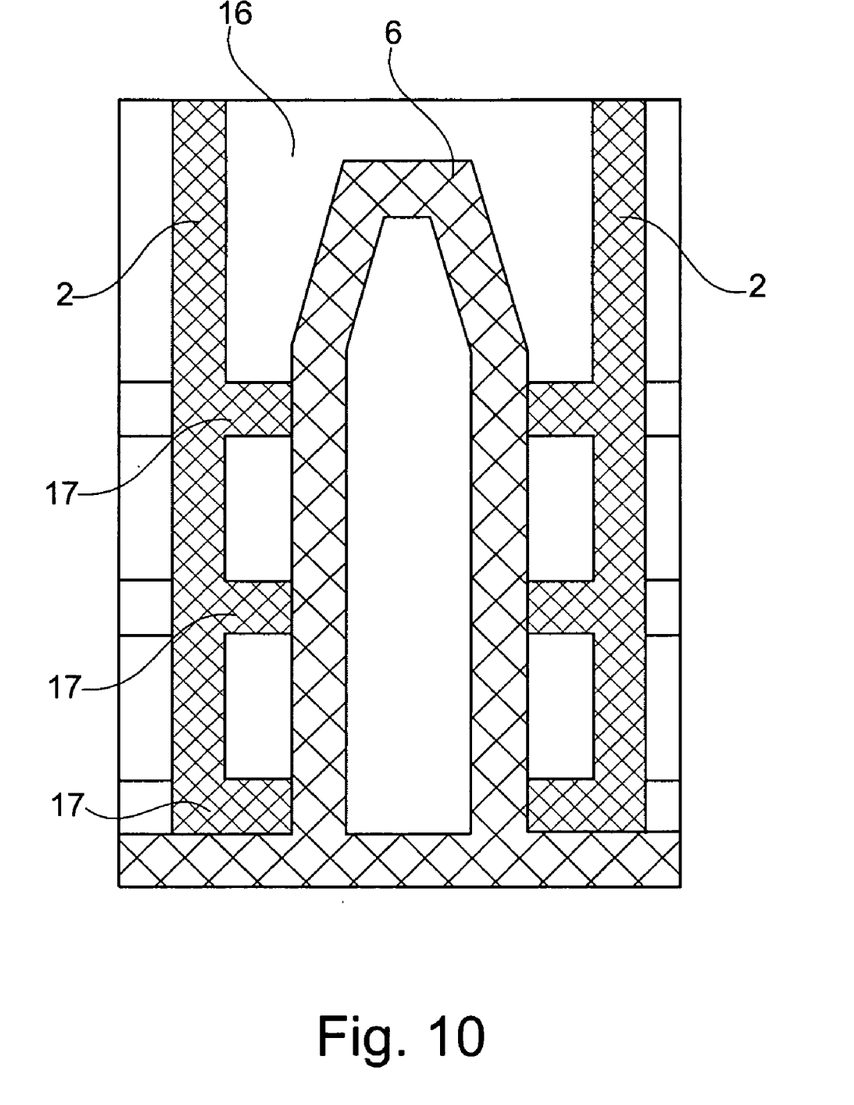

FIG. 10 shows in detail the section through the tooth engagement area of a vertical shaft (16), which is formed by means of the profiled vertical wall (2). The outer dimension of the tooth (6) is slightly smaller than the inner dimension of the vertical shaft (16). This difference is compensated for in that the vertical shaft (16) in the area of the tooth engagement is provided with two or a plurality of horizontal ribs (17), which ensure an accurate fit of the tooth (6) in the tooth engagement area of the shaft (16).

Figures 11A, 11B:
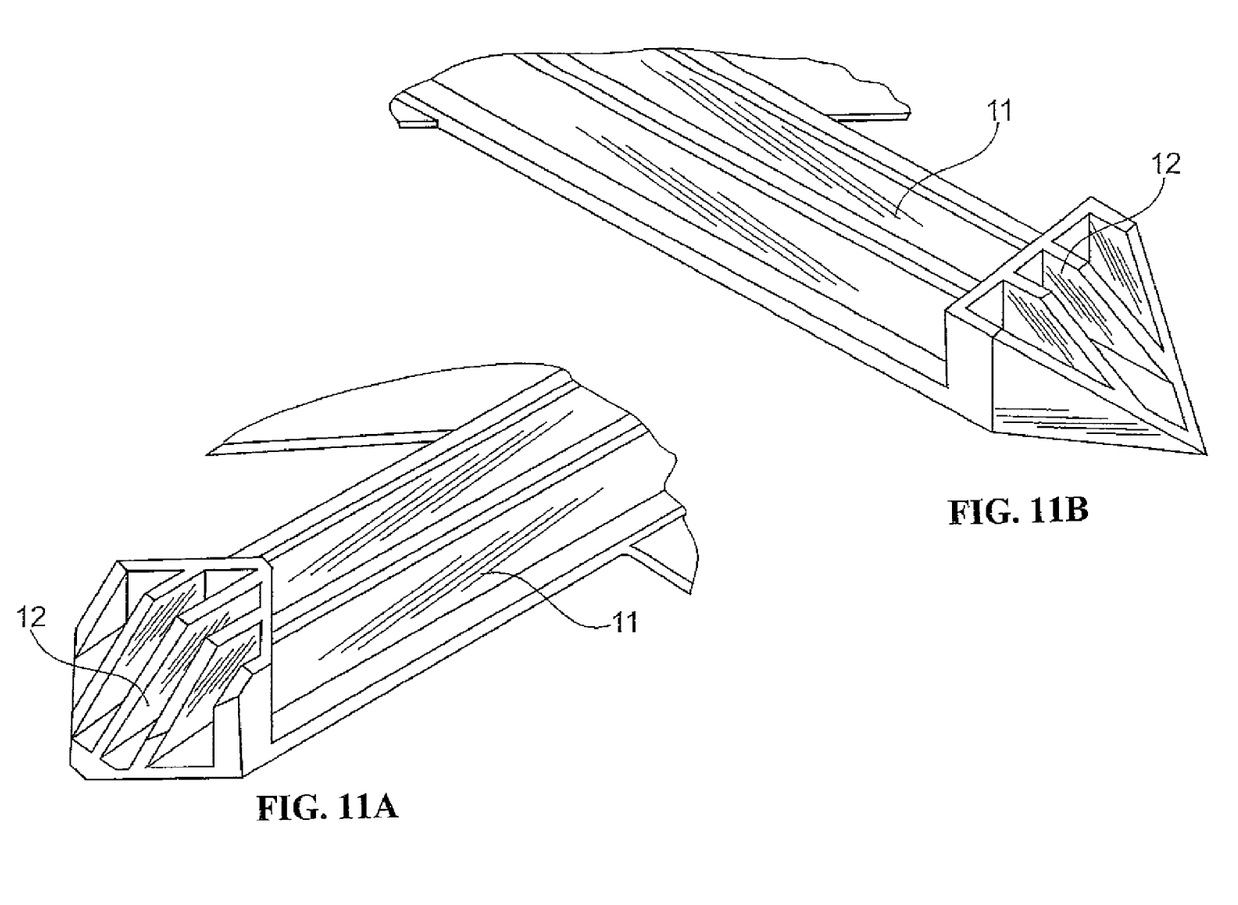
FIGS. 11A and 11B: show detailed illustrations of a resilient finger comprising a locking pin.

FIGS. 11A and 11B show in detail a resilient finger (11) comprising a locking pin (12) in each case. The locking pin (12) shown in FIG 11A is provided for directly engaging with the corner of a module frame and is thus beveled at right angles to the frame in the contact area. The locking pin (12) shown in FIG 11B is provided for engaging with the straight-lined area of the module frame and is thus beveled in a straight-lined manner with the frame in the contact area. In both cases, the locking pin is designed in a beveled manner so as to taper towards the "finger tip", so as to ensure the most unopposed sliding as possible across the rear side surface of the module frame.

Figure 12A:
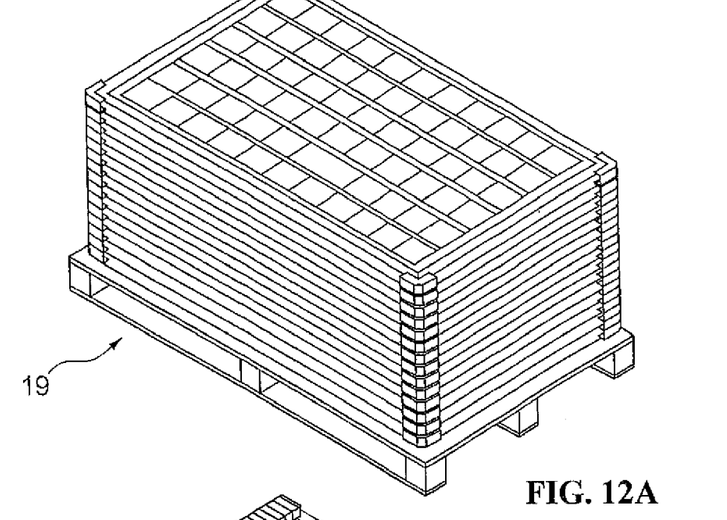
FIG. 12A: shows a view of a horizontally stacked module stack
Figure 12B:
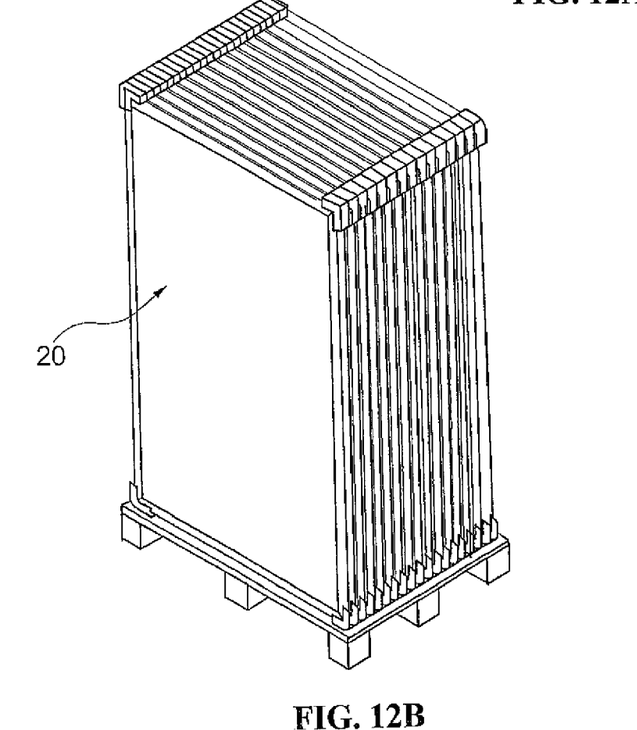
FIG. 12B shows a view of a vertically stacked module stack.

FIG. 12A shows a module stack (19), which is stacked horizontally by means of the holding system according to the invention, and FIG 12B shows a module stack (20), which is stacked vertically by means of the same system.

EXAMPLES

Example 1

Horizontal Stacking in Position "Sunny Side Down"

The module manufacturer required for the framed photovoltaic module in the standard format 100×170 cm to be made stackable in the end phase of the production, namely in the hardening phase of the adhesive after the adhesion of the frame profiles made of aluminum, in the most economical manner, so as to store them in horizontal stacks of 36 modules in each case on suitable pallets, initially in a two-story pallet storage rack and to then send them in the same form to the customer.

In the mentioned hardening phase of the adhesive, the modules are located in the position "sunny side down", that is, with the rear side facing up. A molded part of the holding system according to the invention, which is embodied as a corner piece, was attached to each of the 4 corners of the framed module from lateral direction until the engagement of the lock—a process of a few seconds. The corner pieces were embodied according to patent claim 4: The horizontal bearing surface for the accommodation of the "sunny side" of the module frame as well as of the row of tooth engagement openings was arranged on the lower horizontal closure of each molded part. A diagonally arranged resilient finger comprising a locking pin as well as the tooth row for the mechanical cogging with the adjacent molded part were arranged on the upper horizontal closure. By means of a vacuum gripper, the first module, which is equipped with the corner pieces, was lifted and placed onto the pallet. The second and all further modules, which are equipped with corner pieces, was placed thereabove so as to fit accurately, wherein the teeth of the corner pieces located on the top in each case engage with the tooth engagement openings located below of the corner pieces, which are to be stored thereabove. Four stable pillars were formed by means of this cogging, via which the load of the modules is transferred onto the pallet.

The pallet stack was shrink-wrapped with a suitable film for the transport to the customer and was braced to the pallet by means of tightening straps.

At the customer, the modules are to initially be restacked into smaller batches of 12 modules each, that is, they are to be distributed onto three pallets. For this, the individual modules including the corner pieces located thereon were lifted individually by means of manual vacuum grippers and were restacked onto the new pallets.

After the transport to the construction site, the modules were individually lifted from the stack by hand. The corner pieces were removed from the frame only immediately prior to the assembly of the individual module, as they represent an effective corner and edge protection when handling the modules on the construction site, e.g., when carrying around and placing the modules on the ground.

Example 2

Horizontal Stacking in Position "Sunny Side Up"

In the batch storage of another module manufacturer, solar modules should also be stacked horizontally onto pallets in standard dimensions. Due to logistic requirements, the stacking should take place in the position "sunny side up", that is, with the solar use side facing up. The same stacking method as was described in example 1 was used. However, molded parts according to the invention, as shown in FIG. 1 and in FIG. 2 and as described in patent claim 2, were used. The resilient finger comprising the locking pin as well as the row of engagement openings was located on the lower horizontal closure of each molded part, while the bearing surface for the accommodation of the "sunny side" of the module frame as well as the tooth row for the mechanical cogging with the adjacent molded part are arranged on the upper horizontal closure of each molded part.

Example 3

Horizontal Stacking with Corner and Side Pieces.

Solar modules in very long special designs in the format 260×100 cm should be stacked horizontally.

On principle, the object should be solved as is described in examples 1 and 2. However, the modules had to be prevented from bending in an unacceptable manner towards the center due to their enormous length and for them to possibly be damaged during road transport. The modules were thus not only equipped with corner pieces according to the invention, but elongate side pieces according to the invention—as illustrated in FIG. 6—were additionally attached to the center of the long sides of each module. In addition to the four corner pillars, which are formed by means of the corner pieces, two laterally arranged support pillars were thus created, which also disburden the module stack in the area of the center.

Example 4

Vertical Stacking

Upon request of a module manufacturer, 20 solar modules comprising a surface of 1.7 square meters are to be stacked on suitable pallets in each case in vertical position. In practical attempts, it was confirmed that the corner pieces according to the invention used in examples 1-3 cannot only be used for a horizontal stacking, but likewise for a vertical stacking without any problems. The lifting of the modules—previously equipped with four corner pieces according to the invention—, which were initially stored horizontally and the tilting into the vertical position took place by means of a programmable vacuum gripper. A vertical support device comprising a slightly inclined vertical plane was used for vertically setting down the first module onto the pallet and for adding the second module onto the pallet. This support device was no longer necessary for adding all further modules.

The invention claimed is:

1. A holding system for horizontally or vertically stacking framed photovoltaic or solar thermal flat modules, comprising:

a module frame having a front side and a rear side; and a plurality of molded parts adapted to be combined to form stable vertical pillars or horizontal rails by mechanical cogging among one another and by locking to the module frame, each of said molded parts comprising:
a vertical wall;
a horizontal closure that is equipped with a closing plate and at least one resilient finger, each finger comprising a locking device for engaging with the rear side of the module frame and
another horizontal closure comprising a closing plate having a bearing surface for accommodating the front side of the module frame,
wherein one of the horizontal closures comprises a row of teeth for mechanical cogging with a row of tooth engagement openings in an adjacent molded part, wherein the other of the horizontal closures comprises a row of tooth engagement openings for mechanical cogging with the row of teeth in an adjacent molded part, and wherein the teeth comprise three- or multi-leaf or star-shaped studs, respectively.

2. The holding system according to claim 1, wherein the two horizontal closures comprise an upper horizontal closure and a lower horizontal closure, and wherein the lower horizontal closure of each molded part has a row of tooth engagement openings, and wherein the upper horizontal closure has the bearing surface for accommodating the front side of the module frame and the row of teeth for mechanically cogging with the adjacent molded part, so that the solar modules are stacked horizontally.

3. The holding system according to claim 2, wherein another resilient finger is arranged on the upper horizontal closure of each molded part.

4. The holding system according to claim 2, wherein the molded parts are adapted for vertically stacking the solar modules.

5. The holding system according to claim 1, wherein the two horizontal closures comprise an upper horizontal closure and a lower horizontal closure, and wherein the horizontal bearing surface for accommodating the front side of the module frame as well as the row of tooth engagement openings is arranged on a lower horizontal closure of each molded part for horizontally stacking the solar modules, wherein the resilient finger comprising the locking device and the row of teeth for mechanically cogging with the adjacent molded part are arranged on the upper horizontal closure of each molded part.

6. The holding system according to claim 5, wherein another resilient finger is arranged on the lower horizontal closure of each molded part.

7. The holding system according to claim 1, wherein the molded parts are embodied as right-angled corner pieces, which engage with corners of the module frame.

8. The holding system according to claim 1, wherein the molded parts are embodied as elongate parts, which engage with sides of the module frame.

9. The holding system according to claim 1, wherein the vertical wall has a meandering profile, having a square, rectangular, trapezoidal or parallelogram-shaped profile structure.

10. The holding system according to claim 1, wherein the vertical wall is stabilized by at least one horizontal bar.

11. The holding system according to claim 1, wherein the tooth engagement openings each have a shape that corresponds to a profile form of the vertical wall.

12. The holding system according to claim 1, wherein an end area of each of the teeth is beveled so as to taper on all sides.

13. The holding system according to claim 1, wherein the rows of teeth and corresponding tooth engagement openings are interrupted by tooth gaps, which provide for the application of tightening straps after a stacking process of the modules has taken place.

14. The holding system according to claim 1, wherein there are accommodating surfaces located at the horizontal closures of the molded parts and wherein said accommodating surfaces are reinforced by ribs.

15. The holding system according to claim 1, wherein the molded parts are plastic injection molding parts.

16. A holding system for horizontally or vertically stacking framed photovoltaic or solar thermal flat modules, comprising:
a module frame having a front side and a rear side; and
a plurality of molded parts adapted to be combined to form stable vertical pillars or horizontal rails by mechanical cogging among one another and by locking to the module frame, each of said molded parts comprising:
a vertical wall;
a horizontal closure that is equipped with a closing plate and at least one resilient finger, each finger comprising a locking device for engaging with the rear side of the module frame; and
another horizontal closure comprising a closing plate having a bearing surface for accommodating the front side of the module frame
wherein one of the horizontal closures comprises a row of teeth for mechanical cogging with a row of tooth engagement openings in an adjacent molded part, wherein the other of the horizontal closures comprises a row of tooth engagement openings for mechanical cogging with the row of teeth in an adjacent molded part,
wherein the vertical wall comprises vertical shafts, and wherein an outer periphery of each of the teeth is smaller than an inner periphery of the vertical shafts, and wherein the tooth engagement openings are provided with a plurality of horizontal ribs, which ensure an accurately fitting engagement of the teeth.

* * * * *